United States Patent [19]

Fukaya

[11] Patent Number: 4,552,118

[45] Date of Patent: Nov. 12, 1985

[54] CONTROL CIRCUIT FOR CONTROLLING OUTPUT PULSE WIDTH USING NEGATIVE FEEDBACK SIGNAL

[75] Inventor: Hirokazu Fukaya, Tokyo, Japan

[73] Assignee: NEC Corporation, Japan

[21] Appl. No.: 590,662

[22] Filed: Mar. 19, 1984

[30] Foreign Application Priority Data

Mar. 17, 1983 [JP] Japan .................................. 58-44734

[51] Int. Cl.$^4$ .............................................. F02P 3/04
[52] U.S. Cl. .................................. 123/609; 123/644; 307/267
[58] Field of Search ............... 123/490, 609, 610, 611, 123/644; 307/234, 265, 266, 267

[56] References Cited

U.S. PATENT DOCUMENTS

| | | | |
|---|---|---|---|
| 4,043,302 | 8/1977 | Sessions | 123/609 |
| 4,153,032 | 5/1979 | Chateau | 123/610 |
| 4,174,696 | 11/1979 | Jundt et al. | 123/644 |
| 4,248,195 | 2/1981 | Gorille | 123/609 X |
| 4,298,941 | 11/1981 | Furuhashi | 123/609 X |

Primary Examiner—Tony M. Argenbright
Attorney, Agent, or Firm—Sughrue, Mion, Zinn, Macpeak, and Seas

[57] ABSTRACT

A pulse width control circuit for controlling a pulse width of the output signal using a negative feedback signal, which includes a circuit for detecting the pulse width of the output signal. This detector circuit generates a detection output when the pulse width of the output signal is shorter than a predetermined width. There is also provided a circuit operating in response to the detection output, which circuit acts on the control circuit to forcibly vary the feedback signal, resulting in that the pulse width of the output signal is broadened.

18 Claims, 10 Drawing Figures

CONTROL CIRCUIT FOR CONTROLLING OUTPUT PULSE WIDTH USING NEGATIVE FEEDBACK SIGNAL

BACKGROUND OF THE INVENTION

The present invention relates to a control circuit for controlling the pulse width of an output pulse signal by an input signal and a negative feedback signal, and more particularly, to a circuit for controlling the pulse width of a pulse signal used for determining a current supply time to an ignition coil in an ignition system for an internal combustion engine.

There is often required a circuit for generating an output signal a which has a cycle period varied in response to change in cycle period of an input signal, but has a pulse width substantially constant regardless of any change in the pulse width of the input signal. To this end, the pulse width of the output signal is controlled to be substantially constant, by the input signal and a negative feedback signal produced in response to the output signal. The term "pulse width" of a signal as used in this specification means a time period when the signal takes a high level or a low level within one cycle period.

Since the output signal is in the form of a pulse signal, the negative feedback signal is produced by converting the output signal into a first d.c. signal relative to the pulse width thereof. In more detail, the output signal is detected in the form of a pulse current flowing through a load driven by the output signal, and the pulse current is smoothed. On the other hand, the input signal is also converted into a second d.c. signal relative to a pulse width thereof. These first and second d.c. signals are utilized to control the pulse width of the output signal.

The circuit of this type can be applied to an ignition system in an internal combustion engine for the purpose of making the ignition energy from an ignition coil substantially constant. More specifically, the pulse signal in synchronism with the revolution of the engine is employed as the input signal. Therefore, the cycle period (the frequency) of the input signal is varied in accordance with the number of revolutions of the engine. The pulse width of the input signal is also varied in accordance with the number of revolutions of the engine. The output signal is used for controlling a current supply time to the ignition coil. In other words, a time period in which the output signal takes, for example, a high level (i.e., the pulse width of the output signal) affords the current supply time to the coil. The negative feedback signal is generated in the form of a first d.c. signal in response to the current flowing through the coil. The input signal is converted into a second d.c. signal relative to the pulse width of the input signal. The first and second d.c. signals are compared with each other to control the pulse width of the output signal. As a result, the pulse width of the output signal becomes substantially constant, and the sufficient and substantially constant ignition energy is generated from the ignition coil over the entire range from a low revolution speed to a high revolution speed of the engine.

If the pulse width of the input signal is, for example, shortened or prolonged for each period, there occurs such a serious problem that it becomes impossible to obtain the output signal having a predetermined pulse width. This is because the pulse width of the output signal is controlled by the input and negative feedback signals. More specifically, when the engine is under smooth revolution and producing an input signal having a pulse width corresponding to the number of revolutions of the engine, the cycle period (or pulse width) of the input signal is gradually varied in accordance with the acceleration and deceleration of the engine. Since the time-constant for the conversion of the output signal to the negative feedback signal is set smaller than such a gradual change in cycle period of the input signal, the output signal may be controlled so as to have a substantially constant pulse width. However, the engine is not always under smooth revolution. For example, the engine is started with the aid of self-starting motors. Further, in the severe winter season, the viscosity of the engine oil is increased to impair the smooth reciprocal movement of pistons. In such cases, smooth revolution of the engine can not be obtained. Consequently, the pulse width of the input signal produced in synchronism with the engine revolution, may be randomly shortened or prolonged for each period, even when the frequency of the input signal is constant. Thus, the conversion time-constant for producing the negative feedback signal becomes larger than the change in the pulse width of the input signal, thereby generating an output signal having a pulse width small than the desired one. Such an undesired output signal is generated frequently if the pulse width of the input signal undergoes random changes continually. As previously mentioned, the current supply time to the ignition coil is determined by the pulse width of the output signal. The ignition coil is an inductive element, so that a current flowing therethrough is increased gradually in accordance with the time-constant which is determined by the inductance and resistance components of the coil. Therefore, the reduction in pulse width of the output signal causes a malfunction that the current flowing through the ignition coil does not reach the predetermined value. In other words, insufficient ignition energy is generated from the ignition coil. The insufficient ignition energy results in incomplete combustion of a gas mixture within the cylinder. If such a condition is repeated frequently, environmental pollution will be caused.

SUMMARY OF THE INVENTION

It is therefore an object of the present invention to provide an improved pulse width control circuit using a negative feedback signal.

Another object of the present invention is to provide a pulse width control circuit suitable for use in an ignition system of internal combustion engines.

Still another object of the present invention is to provide a control circuit in which the frequent generation of an output signal having a pulse width smaller than a predetermined width is prevented.

An additional object of the present invention is to provide a detector for detecting a pulse having a pulse height less than a predetermined voltage.

A control circuit according to the present invention comprises a first circuit receiving an input signal and generating an output pulse signal and a feedback signal, the output pulse signal having a pulse width controlled by the input and feedback signals, a second circuit detecting the pulse width of the output signal and generating a detection signal when the detected width is narrower than a predetermined width, and a third circuit acting on the first circuit so as to broaden the pulse width of the output signal in response to the detection signal from the second circuit.

Thus, the circuit according to the present invention is provided with an additional loop consisting of the second and third circuits for changing the pulse width of the output signal in response to the detection signal in addition to a main loop for controlling the pulse width of the output signal by a negative feedback. When the pulse width of the output signal becomes narrower than the predetermined width due to the change in pulse width of the input signal for each period, the additional loop operates to broaden the pulse width of the output signal. As a result, even if the random change in pulse width of the input signal is continued, the pulse width of the output signal is broadened so long as the additional loop is under operation, thereby preventing the frequent generation of the output signal having a pulse width smaller than the predetermined width.

The random change in pulse width of the input signal will not continue for a long time, particularly in the ignition system for internal combustion engines. It is, therefore, convenient that a timer circuit is incorporated to control an operation period of the additional loop. It is also convenient that the third circuit acts on the first circuit so as to vary the level of the feedback signal to broaden a pulse width of the output signal. When an inductive element such as an ignition coil is driven by the output signal from the first circuit, the pulse width of the output signal may be monitored by detecting the current flowing through the inductive load. This is because the current flowing through the inductive load is varied in accordance with the time constant thereof.

According to additional feature of the invention, there is provided a pulse detector comprising an input terminal receiving an input pulse signal, a comparator having first and second input ends, a source of a reference voltage which is supplied to said second input end, the comparator comparing the input pulse signal supplied to the first input end with the reference voltage, a non-coincidence detector producing a pulse when the output of the comparator is not coincident with the input pulse signal, and a flip-flop being set and reset in response to the output from the comparator and the non-coincidence detector.

The pulse detector produces a detection output when the input pulse signal is less than the reference voltage. When the input pulse signal is less than the reference voltage, normal output cannot be obtained and the consecutive outputs of the ignition system are not controlled normally. By use of the detection output, however, the control of the ignition system can be easily recovered.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
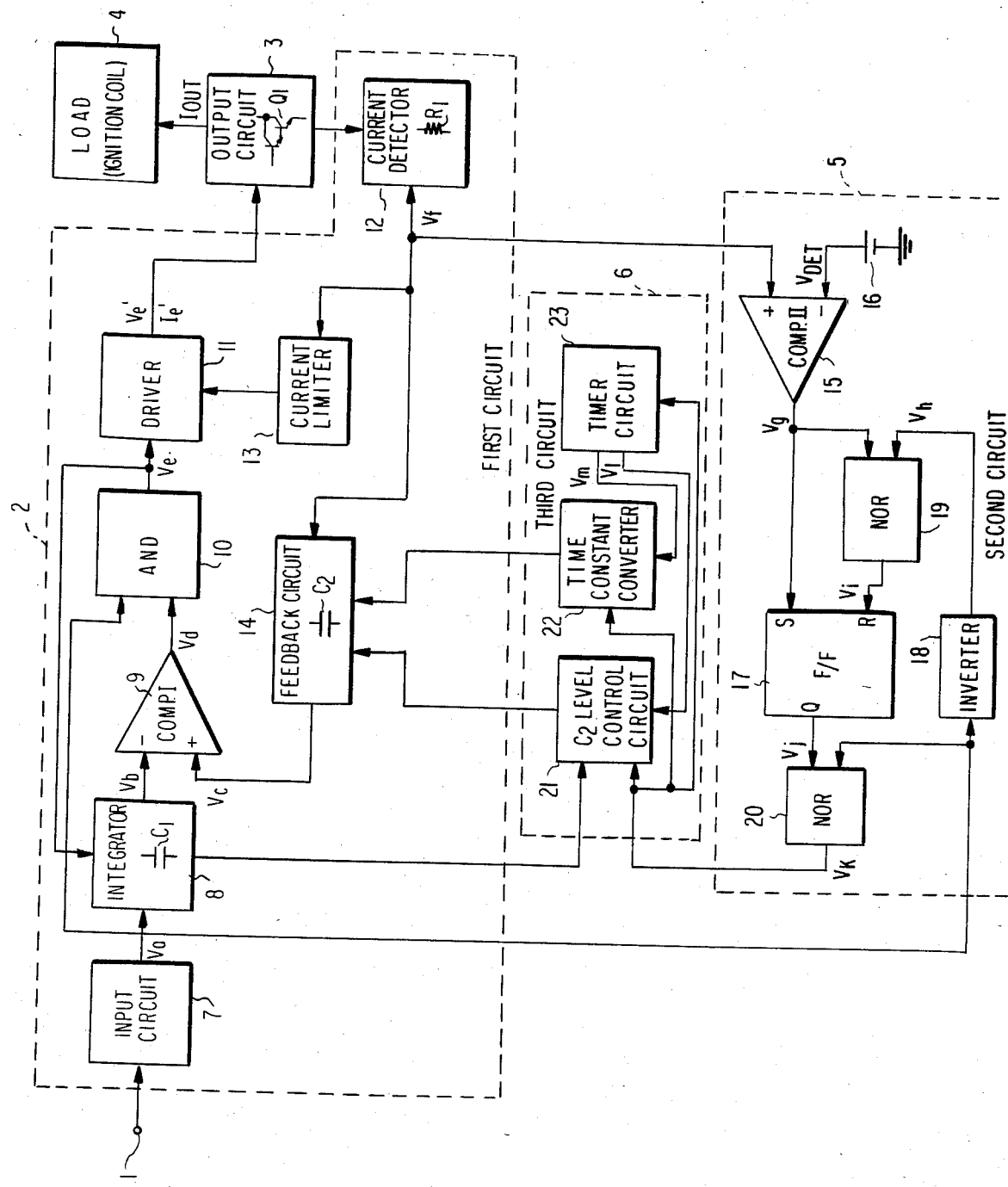
FIG. 1 is a block diagram showing a preferred embodiment of the present invention.

One preferred embodiment of the present invention will be described with reference to FIG. 1. The configuration of the illustrated circuit, which is applied to an ignition system for internal combustion engines, will be described together with its operation represented by voltage and current waveforms shown in FIG. 2. Supplied to an input terminal 1 is an input signal having a frequency (cycle period) in synchronism with the number of revolutions of the engine. The input signal is obtained by detecting the revolution of the engine using a Hall sensor. The duty ratio (the ratio of a high-level period to a low-level period in one cycle period) of the input signal is held constant regardless of the number of revolutions of engine. In other words, the pulse width of the input signal is varied in accordance with the number of revolutions of the engine. The input signal is supplied to an input circuit 7 within a first circuit 2 which serves to make substantially constant the pulse width of an output signal therefrom over a variable frequency range of the input signal. The input circuit 7 produces a wave-shaped signal Va (FIG. 2) of the input signal and may be composed of a comparator or a Schmitt triger circuit by way of example. The signal Va is supplied to an integrator 8. The integrator 8 includes a capacitor $C_1$. This capacitor $C_1$ is charged with a current $I_1$ during the low-level period of the signal Va and discharged with a current $I_2$ ($\neq I_1$, $I_1 > I_2$) during the high-level period thereof. The charge and discharge voltage Vb of the capacitor $C_1$ is supplied to a inverting (−) input terminal of an comparator 9 as the output voltage from the integrator 8. A non-inverting (+) input terminal of the comparator 9 is supplied with a signal Vc from a feedback circuit 14 which is described later. The comparison output between the signals Vb and Vc is supplied to one input end of an AND circuit 10 as a signal Vd. The AND circuit has the other input end supplied with the signal Va. The output Ve of the AND circuit 10 is fed back to the integrator 8 in order to make the charge starting level of the capacitor $C_1$ constant. The signal Ve discharges the capacitor $C_1$ when it has a high level. As a result, the output signal Vb from the integrator 8 has the waveform as shown in FIG. 2. The AND circuit 10 produces the signal Ve shown in FIG. 2 in response to signals Va and Vd. A driver 11 receives the signal Ve to produce a drive signal having voltage and current levels Ve′ and Ie′ (FIG. 2) enough to drive an output circuit 3. The drive signal from the driver 11 is, thereinafter, referred to as signal Ve'. The signal Ve' serves as an output signal of the first circuit 2.

The output circuit 3 is driven by the signal Ve' from the first circuit 2 to supply a current to an ignition coil 4 as a load. The output circuit 3 has a Darlington-connected transistor $Q_1$. The transistor $Q_1$ is turned on when the signal Ve' takes a high level, and thereby a current flows through the coil 4. Accordingly, a current supply time to the ignition coil 4 is determined by the pulse width of the signal Ve'.

Since the ignition coil 4 is an inductive element, the current flowing therethrough is increased in accordance with the time constant which is determined by the inductance component and the resistance component of the coil 4. Eventually, the current $I_{OUT}$ flowing through the ignition coil 4 is varied as shown in FIG. 2.

A current detector 12 detects the current flowing through the ignition coil 4 and has a resistor $R_1$. The resistor $R_1$ is connected to the emitter of the transistor $Q_1$. Since the emitter and collector currents thereof are almost equal to each other, the resistor $R_1$ converts the current $I_{OUT}$ flowing through the coil 4 into a voltage signal $V_f$. Accordingly, the change in level of the signal $V_f$ is similar to that in the current $I_{OUT}$, as shown in FIG. 2. A current limiter 13 makes the ignition energy obtained from the ignition coil 4 constant in response to the signal Vf from the current detector 12. For this purpose, the current limiter 13 detects the voltage across the resistor $R_1$ representing that the current $I_{OUT}$ reaches an $I_{OUT1}$ level, and limits the drive current Ie' so as to maintain the $I_{OUT1}$ level of the current $I_{OUT}$ flowing through the coil 4, as shown in FIG. 2.

The signal Vf from the current detector 12 is further supplied to the feedback circuit 14. The feedback circuit 14 includes a capacitor $C_2$ and controls the charge and discharge of the capacitor $C_2$ in response to the signal Vf. The capacitor $C_2$ is charged with the current $I_3$ when the current $I_{OUT}$ flowing through the ignition coil 4 (resistor $R_1$) is lower than the $I_{OUT1}$ level, and discharged with the current $I_4$ ($\neq I_3$, $I_3 < I_4$), when the current $I_{out}$ is maintained at the $I_{OUT1}$ level. As a result, the capacitor $C_2$ produces the charge/discharge voltage waveform represented by a signal Vc shown in FIG. 2. The signal Vc is supplied to the non-inverting (+) input terminal of the comparator 9 as a negative feedback signal.

In this way, the feedback signal Vc is produced in accordance with the current $I_{OUT}$ flowing through the ignition coil 4, and the pulse width of the signal Ve' for determining a current supply time to the coil 4 is controlled by the feedback signal Vc and the signal Vb. Consequently, although FIG. 2 shows the case that the cycle period of the signal Va is constant (i.e., the number of revolutions of the engine is constant), the levels of the signals Vb and Vc are varied so as to obtain a substantially constant current supply time to the coil 4 (i.e., a substantially constant pulse width of the signal Ve') over the entire revolution range of the engine.

Figure 2:
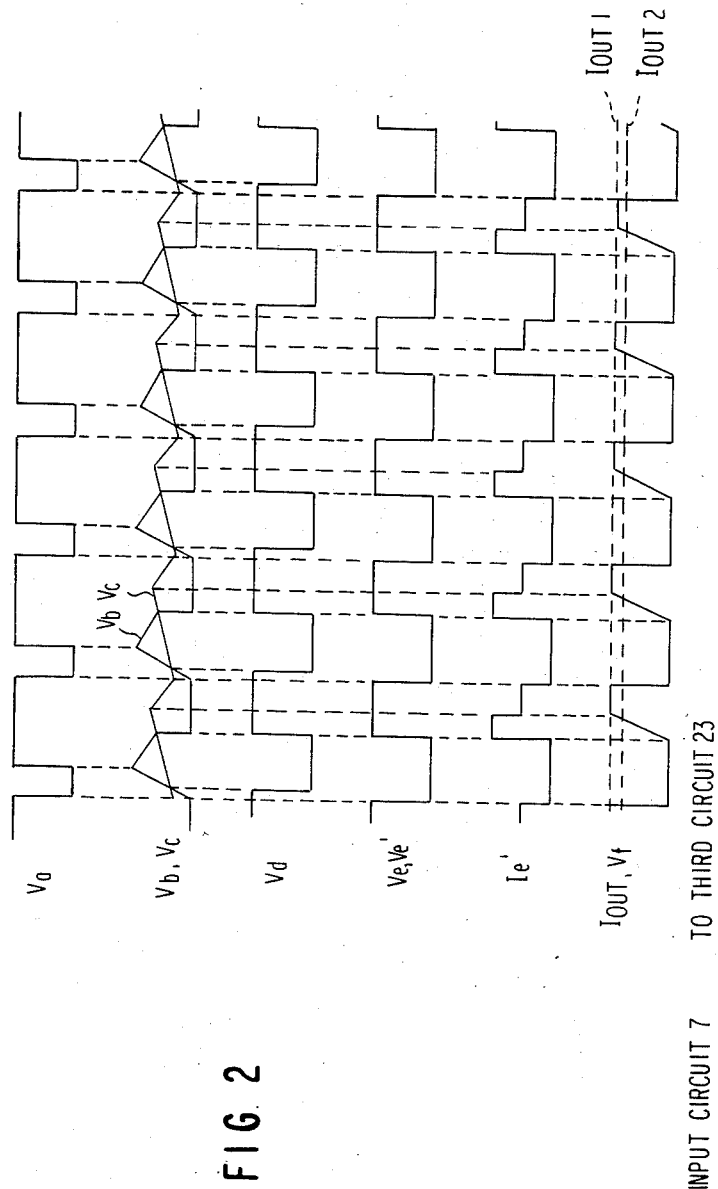
FIG. 2 is a view showing waveforms of voltage and current at respective points of the circuit shown in FIG. 1 under normal operation.

The circuit shown in FIG. 1 further comprises a second circuit 5 for monitoring the pulse width of the output signal (Ve') from the first circuit, and a third circuit 6 for forcibly changing the pulse width of the output signal (Ve') in response to the output of the second circuit 5. The second circuit 5 receives the signal Vf from the current detector 12, and thereby monitors the pulse width of the signal Ve'. This is from the reason that the voltage level of the signal Vf is varied in accordance with the change in the current $I_{OUT}$ flowing through the ignition coil 4 and the current $I_{OUT}$ is controlled by the pulse width of the signal Ve'. If the pulse width of the signal Ve' is shortened, the current $I_{OUT}$ flowing through the ignition coil 4 may not reach the current level $I_{OUT1}$ and may become smaller than a current level $I_{OUT2}$. The second circuit 5 detects the above state in response to the voltage level of the signal Vf. When the maximum value of the current $I_{OUT}$ flowing through the coil is smaller than the current level $I_{OUT2}$, the ignition energy obtained from the coil 4 is not enough to achieve complete combustion of a mixture gas. This results in the air pollution. In the operation wave shown in FIG. 2, the current $I_{OUT}$ reaches the predetermined current level $I_{OUT1}$. Accordingly, the second and third circuits 5 and 6 are not activated in this case. In other words, FIG. 2 shows the current and voltage waveforms upon the normal operation in which the pulse width control of the output signal Ve' is effected in response to the input signal Va having a cycle period corresponding to the revolution of the engine.

Figure 3:
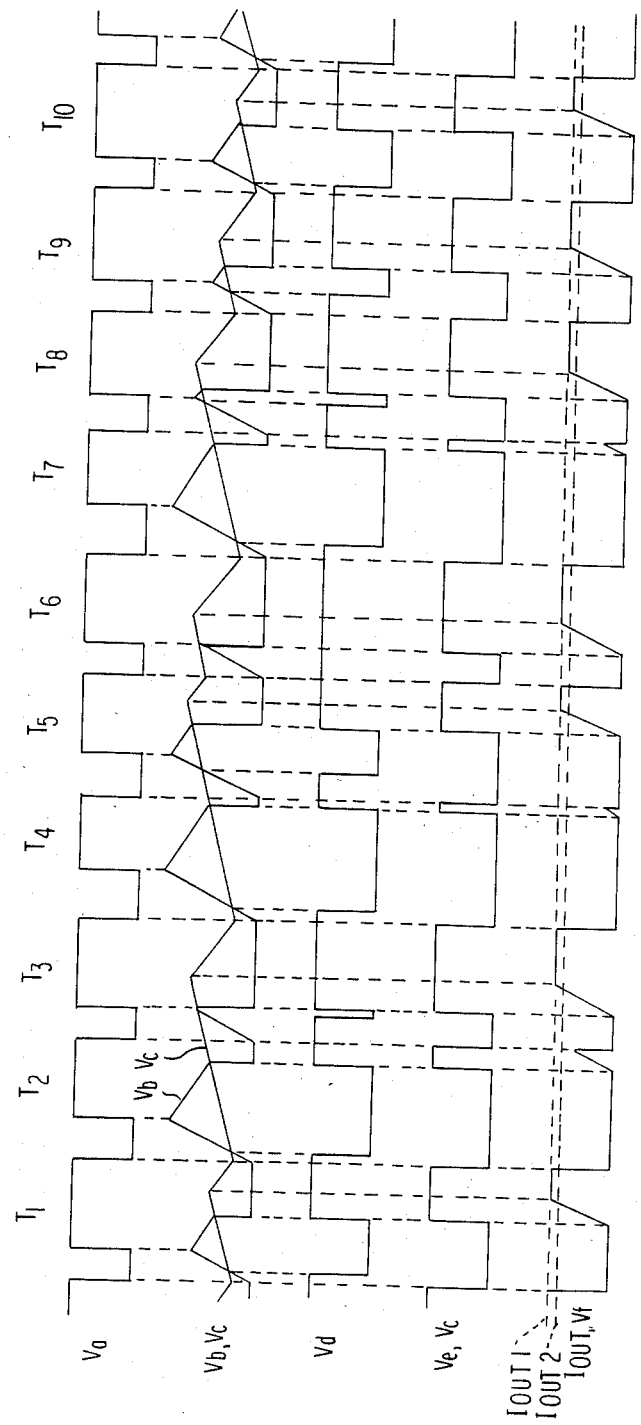
FIG. 3 is a view showing waveforms of voltage and current at the respective points of the circuit without first and second circuits according to the present invention, in the case where the pulse width (period) of the input signal is disturbed randomly.

The engine is not always under the smooth revolution. For example, the engine is started with the aid of a selfstarting motor. Further, in the severe winter season, the engine oil has very high viscosity. In such cases, the smooth revolution of the engine is not effected. For this reason, the cycle period (pulse width) of the signal supplied to the input terminal 1 is shortened or prolonged every few periods, as represented by the signal Va in FIG. 3. This results in the voltage and current waveforms at the respective points, as shown in FIG. 3, in the case that the second and third circuits 5 and 6 are not provided. As seen from FIG. 3, there frequently occurs such a state that the current $I_{OUT}$ flowing through the ignition coil 4 does not reach the predetermined current level $I_{OUT1}$. More specifically, the signal Vb is produced from the capacitor $C_1$ in the integrator 8, which is charged with the current $I_1$ when the signal Va takes a low level and discharged with the current $I_2$ when the signal Va takes a high level. Therefore, the charged level of the capacitor $C_1$ is increased as the low-level period of the signal Va becomes long. On the other hand, the signal Vc of the feedback circuit 14 is produced from the capacitor $C_2$ which is charged with the current $I_3$ when the current $I_{OUT}$ takes a value smaller than the current level $I_{OUT1}$, and discharged with the current $I_4$, when the current $I_{OUT}$ takes the current level $I_{OUT1}$. As indicated by periods $T_1$, $T_2$ shown in FIG. 3, when the pulse width (i.e. a high level period) of the signal Va is abruptly reduced in the period $T_2$, the time period in which the signal Vc exceeds the signal Vb is also abruptly reduced. As a result, the pulse width of the signal Ve becomes small, whereby the current $I_{OUT}$ does not reach the current level $I_{OUT1}$. In the next period $T_3$, the charge of the capacitor $C_1$ is started from the reference level due to the feedback of the signal Vd from the AND circuit 9 to the integrator 8. On the other hand, the output current $I_{OUT}$ has not reached the predetermined level $I_{OUT1}$, the capacitor $C_2$ continues to be charged with the current $I_3$. Consequently, in the period $T_3$, the pulse width of the signal Ve' is abruptly prolonged. This in turn prolongs the time period in which the output current $I_{OUT}$ is at the predetermined level $I_{OUT1}$, so that the capacitor $C_2$ is discharged with the current $I_4$ for a long time. As a result, the charge starting level of the capacitor $C_2$ in the period $T_4$ is relatively lowered. The capacitor $C_1$ in the integrator 8 starts to be charged from the reference level. For this reason, the pulse width of the signal Ve also becomes very short in the period $T_4$, so that there flows a very small amount of the current $I_{OUT}$. Since the current $I_{OUT}$ does not reach the predetermined level $I_{OUT1}$, the capacitor $C_2$ continues to be charged with the current $I_3$ in the period $T_4$. The resultant signal Vc is reflected on the subsequent periods $T_5$ and $T_6$. Consequently, the pulse width of the signal Ve' becomes very short again in the period $T_7$.

As seen from the above description, due to the fact that the signal Vc for controlling the pulse width of the signal Ve is obtained by the charge and discharge of the capacitor $C_2$ in response to the level of the output current $I_{OUT}$, the signal Ve having a pulse width smaller than a predetermined width is produced frequently when the period (pulse width) of the signal Va is disturbed randomly. Particularly, in the periods $T_4$ and $T_7$ in FIG. 3, the current $I_{OUT}$ flows in a very small amount. For this reason, the ignition energy from the ignition coil 4 becomes extremely small, so that a portion of the gas mixture is released directly to the atmosphere as exhaust gas after the incomplete combustion. This results in environmental pollution such as air contamination.

Figure 4:
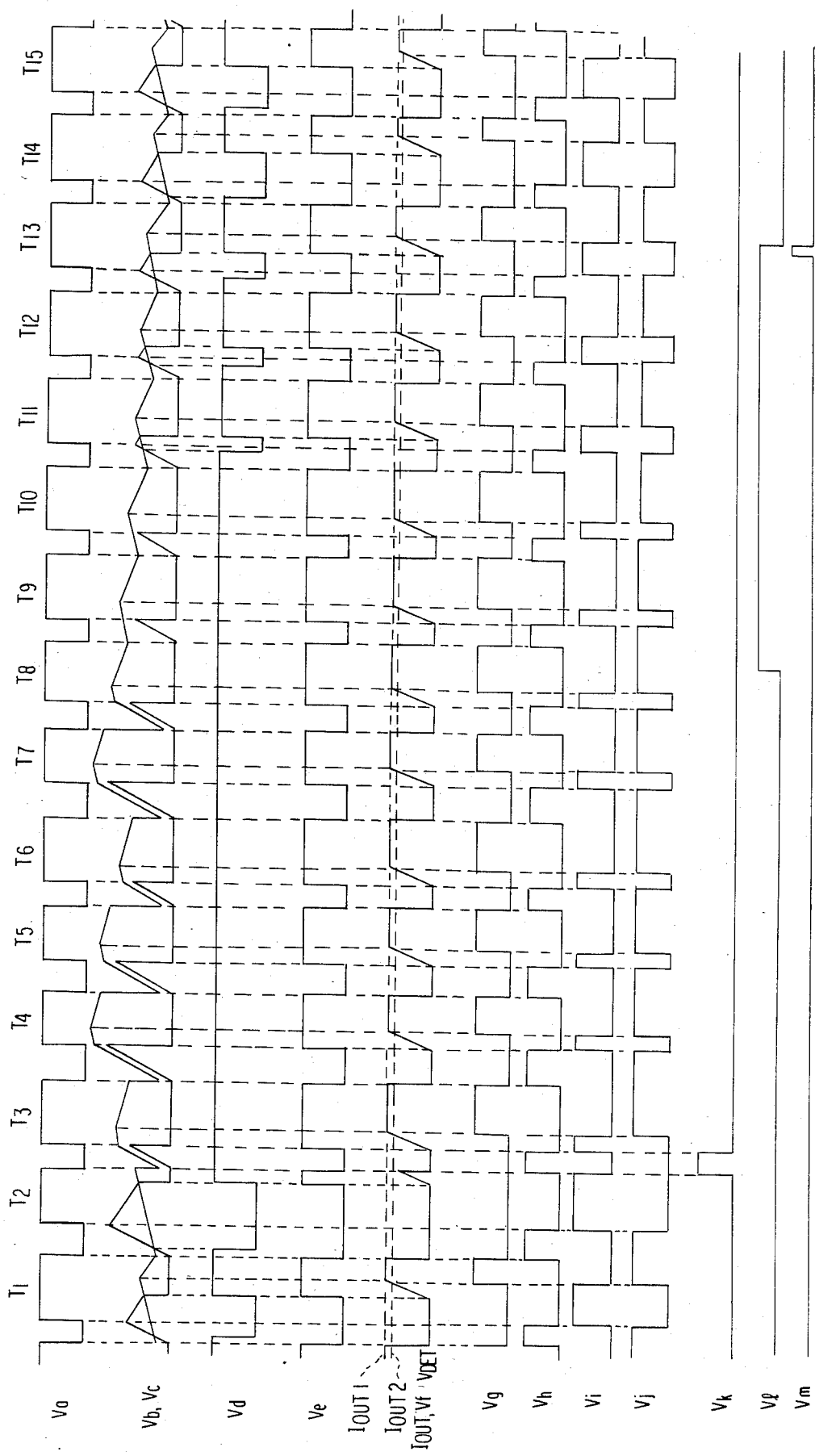
FIG. 4 is a view showing waveforms of voltage and current at the respective points of the circuit shown in FIG. 1, in the case where the pulse width of the input signal is disturbed randomly.

In order to overcome the drawback as mentioned above, the circuit shown in FIG. 1 further includes the second circuit 5 and the third circuit 6. As a result, the operation waveforms as shown in FIG. 4 is obtained even if there occurs a signal similar as the signal Va shown in FIG. 3.

The second circuit 5 includes a comparator 15. The signal Vf from the current detector 12 in the first circuit 2 and the comparison voltage $V_{DET}$ from a reference voltage source 16 are supplied to the non-inverting (+) and inverting (−) input ends of the comparator 15, respectively. The comparison voltage $V_{DET}$ is set at the same voltage as a voltage drop across the resistor $R_1$ obtained when the current $I_{OUT}$ flowing through the ignition coil 4 reaches the current level $I_{OUT2}$. Therefore, the comparator 15 produces a signal Vg having a high level when the current $I_{OUT}$ reaches the current level $I_{OUT2}$ and a low level other than the above case, as shown in FIG. 4. This signal Vg is supplied to the set terminal S of an S-R flip-flop (hereinafter, referred to as S-R F/F) 17 and further to one input end of a NOR circuit 19. The other input end of the NOR circuit 19 is supplied with a signal Vh (see FIG. 4) which is obtained by inverting the signal Va from the input circuit 7 with an inverter 18. The NOR circuit 19 outputs a NOR signal Vi in response to the signals Vg and Vh, as shown in FIG. 4. This signal Vi is supplied to the reset terminal R of the S-R F/F 17. A signal Vj from the Q output of the S-R F/F 17 and the signal Va from the input signal 7 are supplied to two input ends of a NOR circuit 20, respectively. The NOR circuit 20 produces an output signal Vk as an output signal of the second circuit 5. With this arrangement, when the current $I_{OUT}$ flowing through the ignition coil 4 does not reach the current level $I_{OUT2}$ or the voltage of the signal does not reach the level corresponding to the current level $I_{OUT2}$ a pulse signal indicated by Vk is generated, as shown in FIG. 4. In other words, the second circuit 5 detects that the pulse width of the output signal Ve' from the first circuit 2 is so narrow that the current $I_{OUT}$ does not reach the current level $I_{OUT2}$, and then generates the pulse signal Vk. This pulse signal Vk is generated in synchronism with the end of the period of $T_2$ and has a pulse width coincident with the low-level period of the signal Va in the period $T_3$.

The third circuit 6 is activated in response to the pulse signal Vk generated from the second circuit 5. The third circuit 6 comprises a $C_2$ level control circuit 21, a time-constant converter circuit 22 and a timer circuit 23, and these circuits are started to operate by the pulse signal Vk from the second circuit 5. The $C_2$ level control circuit 21 has a function of holding the level of the capacitor $C_2$ in the feedback circuit 14 higher than that of the capacitor $C_1$ in the integrator 8 during the operation thereof. For this purpose, the control circuit 21 monitors the charged level of the capacitor $C_1$ in the integrator 8 and controls the level of the capacitor $C_2$ at a level higher than the charged level of the capacitor $C_1$ by a constant voltage. As seen from FIG. 4, therefore, even if the charged level of the capacitor $C_1$ is varied in accordance with the change of the low-level period of the signal Va, the level of the capacitor $C_2$ is held higher than that charged level. Since the output signal Ve of the AND circuit 10 is fed back to the integrator 8, the capacitor $C_1$ is discharged immediately when the signal Ve takes a high level. In response to this, the level of the capacitor $C_2$ is controlled by the time-constant converter circuit 22.

The time-constant converter circuit 22 has a function of converting the charge and discharge time-constants of the capacitor $C_2$ in the feedback circuit 14, and converts the charge current to the capacitor $C_2$ from $I_3$ to $I_5$ ($<I_3$) and the discharge current of the capacitor $C_2$ from $I_4$ to $I_6$ ($<I_4$), respectively. Although the charge and discharge time-constants of the capacitor $C_2$ are converted by the converter 22, the charge and discharge periods thereof are controlled by the signal Vf from the current detector 12 in a similar manner to that as previously mentioned. Therefore, the capacitor $C_2$ is further charged with the current $I_5$ from the voltage level higher than that of the capacitor $C_1$ at the charge completion time point by the constant level, and then discharged with the current $I_6$ when the output current $I_{OUT}$ comes under the current limiting mode. As a result, the signal Vc obtained from the feedback circuit 14 has the waveform shown in FIG. 4 and takes a level always higher than that of the signal Vb so long as the circuit 21 and the converter 22 are under operation. Whereby, the output signal Vd of the comparator 9 holds a high level, so that the pulse width of output signal Ve' from the first circuit 2 is made coincident with that of the signal Va. The current $I_{OUT}$ flowing through the ignition coil 4 always reaches the predetermined level $I_{OUT1}$ to generate the sufficient and constant ignition energy from the coil 4.

The timer circuit 23 in the third circuit 6 serves to set the operation time of the $C_2$ level control circuit 21 and the time-constant converter 22. As mentioned previously, the pulse signal Vk makes the pulse width of the signal Ve' coincident with that of the input signal Va, so that the current limiting time of the output current $I_{OUT}$ is prolonged. The prolongation of the current limiting time increases the power loss of the transistor $Q_1$ in the output circuit 3. Therefore, the operation of the third circuit 6 for a longer time is not preferred, because the thermal breakdown of the transistor $Q_1$ may occur. It is also to be noted that the random disturbance of the period of the signal Va will not continue for a so long a time. For these reasons, the timer circuit 23 is provided. The timer circuit 23 starts clocking in response to the signal Vk and then generates two signals $V_l$ and Vm. These signals $V_l$ and Vm are not generated simultaneously. The signal $V_l$ is generated before the signal Vm, as shown in FIG. 4. In response to a high level of the signal $V_l$, the $C_2$ level control circuit 21 stops its operation. As a result, the control of the charge and discharge of the capacitor $C_2$ is carried out only by the converter 22, and the charge and discharge times thereof are determined by the level of the output current $I_{OUT}$. This causes the pulse width of the output signal Ve' to be shortened gradually. When the timer circuit 23 generates the signal Vm at a high level, the time-constant converter 22 also stops its operation. The level of the capacitor $C_2$ is hence controlled by the charge/discharge time-constant of the feedback circuit 14 after the period $T_{13}$. That is, the pulse width of the signal Ve' is now controlled by the negative feedback loop in the first circuit 2. The times when those signals $V_l$ and Vm are generated are preferably set at 250 to 500 msec and 550 to 1100 msec, respectively, after the generation of the pulse signal Vk.

As described above, when the second circuit 5 detects that the output current $I_{OUT}$ does not reach the current level $I_{OUT2}$, the third circuit 6 operates to control the signal Vc from the feedback circuit 14 at a level higher than the signal Vb from the integrator 8. As a result, the frequent occurrence of such a state as shown in FIG. 3 where the output current $I_{OUT}$ flows in a very small amount only is prevented.

If desired, the third circuit 5 may be modified to directly act on the comparator 9 so as to control the output signal Vd at a high level for a predetermined time. Incidentally, the first, second and third circuits 2, 5 and 6 are fabricated on one semiconductor substrate as an integrated circuit device, except for the capacitors $C_1$, $C_2$ and the resistor $R_1$.

Figure 5:
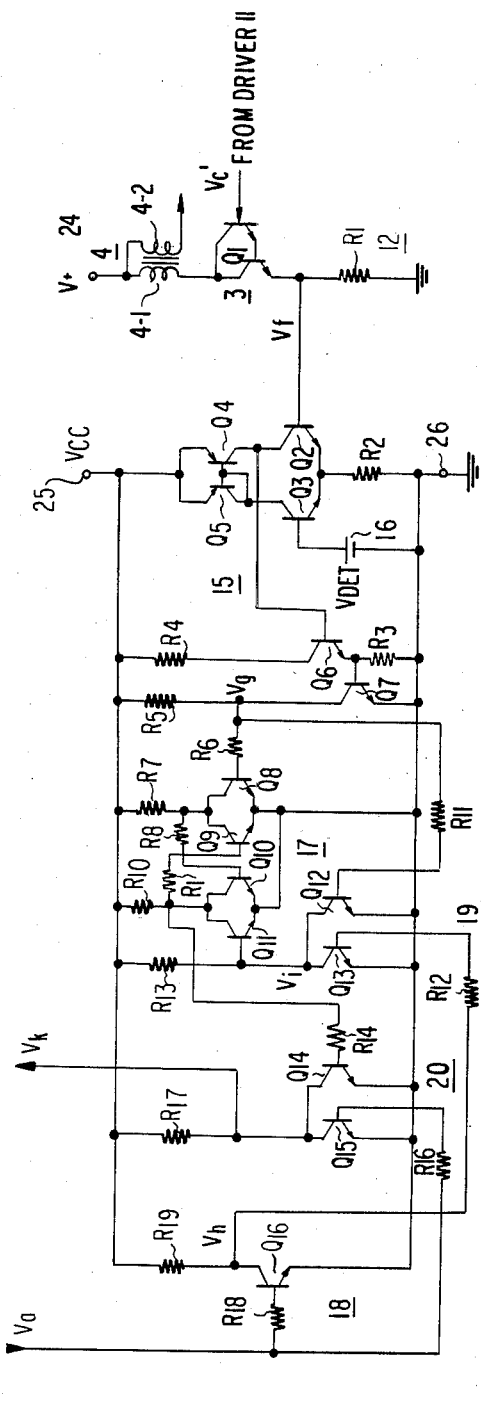
FIG. 5 is a circuit diagram showing a circuit configuration of the second circuit shown in FIG. 1.

FIG. 5 shows one example of the concrete circuit configurations of the output circuit 3 and the second circuit 5, in which the same components as those in FIG. 1 are denoted by the same numerals. The signal Ve' from the driver 11 is supplied to base of the Darligntonconnected transistor $Q_1$, the collector of which is connected to a power supply terminal 24 through a primary winding 4-1 of the ignition coil 4. The emitter of the transistor Q is grounded through the current detection resistor $R_1$. The signal Vf obtained in the form of a voltage drop across the resistor $R_1$ is supplied to base of a transistor $Q_2$ in the comparator 15. The transistor $Q_2$ constitutes a differential amplifier together with a transistor $Q_3$ which has its base supplied with the comparison voltage $V_{DET}$ from the reference voltage source 16. Transistors $Q_4$, $Q_5$ serve as an active load and a resistor $R_2$ serves as a current source. The collector output of the transistor $Q_2$ is supplied to an emitter-follower amplifier comprising a transistor $Q_6$ and resistors $R_3$ and $R_4$. The output of the transistor $Q_6$ is supplied to an inverting amplifier comprising a transistor $Q_7$ and a resistor $R_5$. Those components constitute a comparator 15. When the level of the signal Vf is higher than the comparison voltage $V_{DET}$, the transistor $Q_2$ is turned on and both transistors $Q_6$ and $Q_7$ are cut off. In the contrary case, the transistors $Q_3$ to $Q_7$ are turned on. As a result, the signal Vg is obtained from the collector of the transistor $Q_7$.

The S-R flip-flop (F/F) 17 comprises two pairs of transistors $Q_8$, $Q_9$ and $Q_{10}$, $Q_{11}$, each pair having emitters and collectors commonly connected to each other. Base of the transistor $Q_8$ serves as the set terminal S supplied with the signal Vg through a resistor $R_6$. Base of the transistor $Q_9$ is connected to the collector joint of the transistors $Q_{10}$ and $Q_{11}$ through a resistor $R_9$. Base of the transistor $Q_{10}$ is connected to the collector joint of the transistors $Q_8$ and $Q_9$ through a resistor $R_8$. Resistors $R_7$ and $R_{10}$ serve as collector resistors. Base of the transistor $Q_{11}$ serves as the reset terminal R. The output Q is obtained from collector thereof. The signal Vg is also supplied to the base of a transistor $Q_{12}$ through a resistor $R_{11}$. The transistor $Q_{12}$ constitutes a NOR circuit 19 together with a transistor $Q_{13}$, collectors of the transistors $Q_{12}$ and $Q_{13}$ being commonly connected to the reset terminal R of the S-R F/F 17 (i.e., the base of the transistor $Q_{11}$). A resistor $R_{13}$ is a collector load. The base of the transistor $Q_{13}$ is supplied through a resistor $R_{12}$ with the signal Vh which is obtained by inverting the signal Va through the inverter 18 comprising a transistor $Q_{16}$ and resistors $R_{18}$ and $R_{19}$. When the signal Vg has a high level, the base of the transistor $Q_8$ (the set terminal S) is at a high level and the base of the transistor $Q_{11}$ (the reset terminal R) is at a low level. Accordingly, the transistors $Q_8$ and $Q_9$ are turned on and the transistors $Q_{10}$ and $Q_{11}$ are turned off. As a result, the signal Vj takes a high level. When the signals Vg and Vh have a low level, the set terminal S takes a low level and the reset terminal R takes a high level. The transistors $Q_8$ and $Q_9$ are turned off and the transistors $Q_{10}$ and $Q_{11}$ are turned on. As a result, the signal Vj becomes a low level.

The signal Vj is supplied to the base of a transistor $Q_{14}$ through a resistor $R_{14}$. The transistor $Q_{14}$ constitutes the NOR circuit 20 together with a transistor $Q_{15}$. The transistors $Q_{14}$ and $Q_{15}$ have collectors commonly connected. The base of the transistor $Q_{15}$ is supplied with the signal Va through a resistor $R_{16}$. A load resistor $R_{17}$ is connected to collectors of the transistors $Q_{14}$ and $Q_{15}$. The signal Vk to the third circuit 23 is taken from the collector joint of the transistors $Q_{14}$ and $Q_{15}$. When the signals Vj and Va are a low level, the transistors $Q_{14}$ and $Q_{15}$ are turned off, resulting in the pulse signal Vk taking a high level, as shown in FIG. 4. A stabilized voltage Vcc is supplied to the circuits 15 to 20 from a stabilized voltage supply terminal 25.

Figure 6:
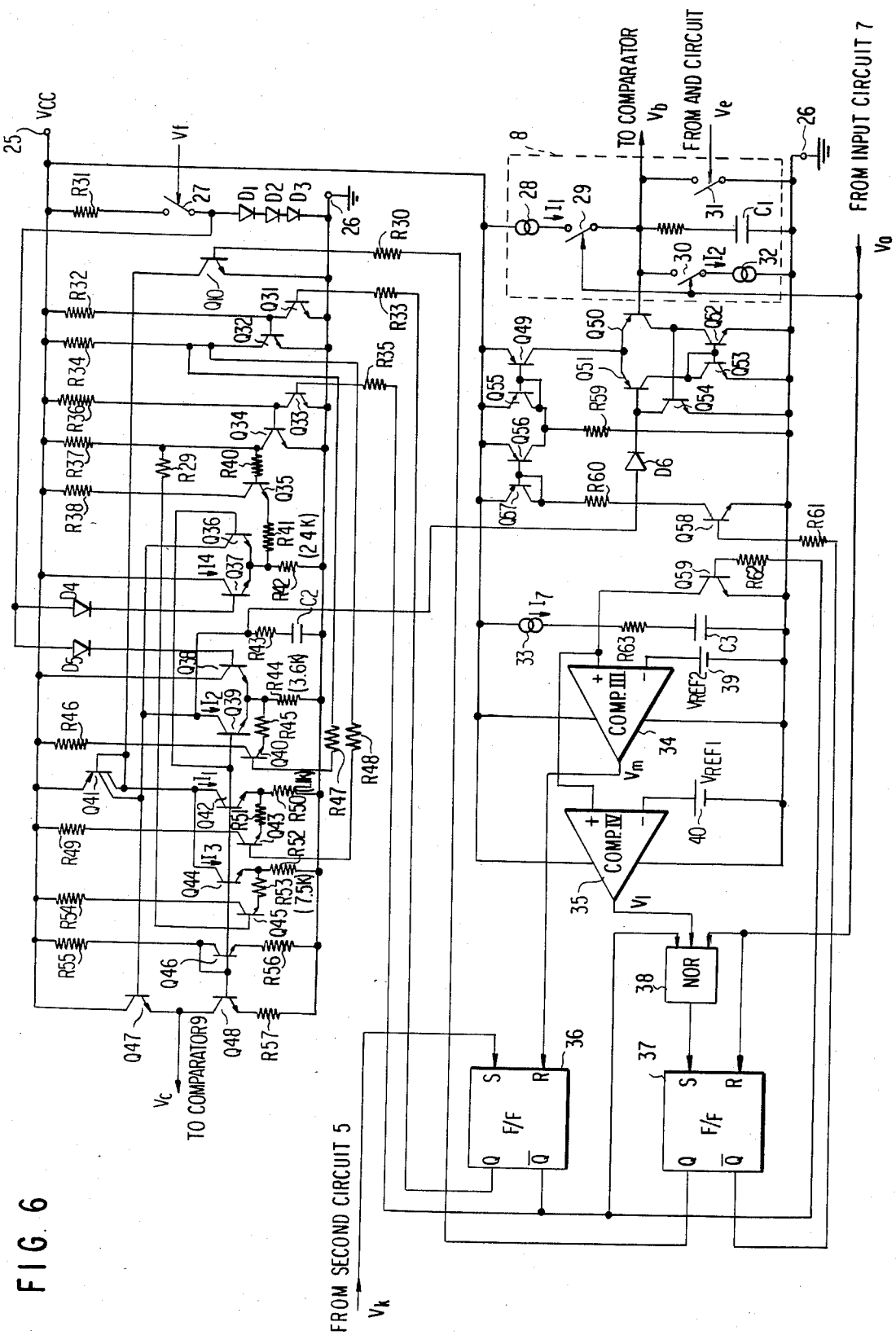
FIG. 6 is a circuit diagram showing a circuit configuration of the third circuit shown in FIG. 1.

Referring now to FIG. 6. The circuit configuration of the third circuit 6 will be described. It is to be noted that FIG. 6 includes the feedback circuit 14 and integrator 8 to describe the operation of the third circuit 6. When the signal Vk from the second circuit 5 is under a low-level state, i.e., when the current $I_{OUT}$ flowing through the ignition coil 4 reaches the current level $I_{OUT1}$, an S-R flip-flop (F/F) 36 is in the reset state. Accordingly, its output Q takes a low level and its inverted output $\overline{Q}$ takes a high level. The high-level of the inverted output $\overline{Q}$ holds the output of a three-input NOR circuit 38 at a low level, so that another S-R flip-flop (F/F) 37 is in the reset state. The inverted output $\overline{Q}$ of the S-R F/F 36 is also supplied to the base of a transistor $Q_{59}$ through a resistor $R_{62}$ to turn on the transistor $Q_{59}$. Accordingly, a current $I_7$ from a constant-current source 33 flows through the transistor $Q_{59}$ and a capacitor $C_3$ is not charged. The capacitor $C_3$ constitutes the timer circuit 23. The inverted output $\overline{Q}$ of the S-R F/F 36 is further supplied to the base of a transistor $Q_{33}$ through a resistor $R_{35}$ to turn on the transistor $Q_{33}$ and off a transistor $Q_{34}$. Resistors $R_{36}$ and $R_{37}$ are collector resistors. A high level signal at the collector of the transistor $Q_{34}$ is supplied to the bases of transistors $Q_{45}$ and $Q_{35}$ through resistors $R_{39}$ and $R_{40}$, respectively. These transistors $Q_{45}$ and $Q_{35}$ are turned on to hold the emitter potential of the transistors $Q_{44}$ and the emitter potentials of the transistors $Q_{36}$ and $Q_{37}$ at a high level through resistors $R_{54}$, $R_{53}$ and $R_{38}$, $R_{41}$, respectively. As a result, the transistors $Q_{44}$, $Q_{36}$ and $Q_{37}$ are cut off. On the other hand, the low-level of the output Q of the S-R F/F 36 is supplied to the base of a transistor $Q_{31}$ through a resistor $R_{33}$. Therefore, the transistor $Q_{31}$ is cut off and a transistor $Q_{32}$ is turned on. Resistors $R_{32}$ and $R_{34}$ are collector resistors thereof. Low-level collector output of the transistor $Q_{32}$ is supplied to bases of transistors $Q_{40}$ and $Q_{43}$ through resistors $R_{47}$ and $R_{48}$, respectively. As a consequence, these transistors $Q_{40}$, $Q_{43}$ are cut off, thereby activating transistors $Q_{38}$, $Q_{39}$ and $Q_{42}$.

The low-level of the output Q of the S-R F/F 37 is supplied through a resistor $R_{30}$ to a transistor $Q_{30}$ to turn off this transistor. The high-level of the inverted output $\overline{Q}$ of F/F 37 is supplied to the base of a transistor $Q_{58}$ through a resistor $R_{61}$, thus turning on the transistor $Q_{58}$. Therefore, a current flows through a diode-connected transistor $Q_{57}$ through a resistor $R_{60}$ to bring a transistor $Q_{56}$ having a collector resistor $R_{59}$ into a saturation state. Since the collector of a transistor $Q_{55}$ is connected to the collector of the transistor $Q_{56}$, the transistor $Q_{55}$ comes into the off state when the transistor $Q_{56}$ is saturated. As a result, a transistor $Q_{49}$ is held in the off state, thus deactivating transistors $Q_{50}$ to $Q_{54}$ which constitute a differential amplifier having the transistor $Q_{49}$ as a current source.

Thus, the transistors $Q_{38}$, $Q_{39}$ and $Q_{42}$ become operable to produce the feedback signal Vc.

The transistors $Q_{38}$ and $Q_{39}$ are connected to each other in a differential fashion. The base of transistor $Q_{39}$ is supplied with a bias voltage through resistors $R_{55}$, $R_{56}$ and a diode-connected transistor $Q_{46}$. On the other hand, the base of the transistor $Q_{38}$ is supplied through a diode $D_5$ with a voltage across three diodes $D_1$ to $D_3$ connected in series. Since a current flows through the diodes $D_1$ to $D_3$, a resistor $R_{31}$ and a switch 27, the diodes $D_1$ to $D_3$ produces forward voltage drops only when the switch 27 is closed. The switch 27 is opened and closed in response to the signal Vf from the current detector 12. That is, the switch 27 is opened when the current $I_{OUT}$ flowing through the ignition coil 4 takes the current level $I_{OUT1}$, and closed except for the above state. The switch 27 is electronically constituted by the use of a transistor element. When the switch 27 is closed, the diodes $D_1$ to $D_3$ are biased. Consequently a voltage having a level of $2 \times V_F$ ($V_F$ representing a forward voltage drop across a diode) is supplied to the base of the transistor $Q_{38}$. On the other hand, the base of the transistor $Q_{39}$ is supplied with the bias voltage having a level almost equal to $V_F$ by the diode-connected transistor $Q_{46}$. Therefore, the transistor $Q_{39}$ is cut off and the transistor $Q_{38}$ is turned on. The collector of the transistor $Q_{39}$ is connected to the capacitor $C_2$ through a resistor $R_{43}$, so that the capacitor $C_2$ is not discharged in this state.

The transistor $Q_{42}$ is in a conduction state, since it is biased by the diode-connected transistor $Q_{46}$. A transistor $Q_{42}$ has two collectors, in which its first collector is connected to the base to constitute a current mirror circuit. Since the transistor $Q_{42}$ is connected to the junction point between the first collector and the base of the transistor $Q_{41}$, the current flowing through the transistor $Q_{42}$ is obtained from the second collector of the transistor $Q_{41}$. The second collector of the transistor is connected to the capacitor $C_2$ through a resistor $R_{43}$. Accordingly, the capacitor $C_2$ is charged with the current $I_1$ flowing through the transistor $Q_{42}$, when the transistor $Q_{39}$ is in an off-state.

When the output current $I_{OUT}$ reaches the current level $I_{OUT1}$ and it comes into the current limiting state, the switch 27 is opened to turn the transistor $Q_{38}$ off. As a result, the transistor $Q_{39}$ is turned on to discharge the capacitor $C_2$ with the current $I_2$ flowing through the transistor $Q_{39}$. The voltage across the capacitor $C_2$ are supplied to the non-inverting (+) input terminal of the comparator 9 as the feedback signal Vc through an emitter-follower transistor $Q_{47}$ having an active load composed of a transistor $Q_{48}$ and a resistor $R_{57}$.

When the signal $V_k$ having a high level (see FIG. 4) is supplied from the second circuit 5 to the F/F 36, the F/F 36 is in the set state, so that its outputs Q and $\overline{Q}$ take a high level and a low level, respectively. Therefore, the transistors $Q_{38}$, $Q_{39}$ and $Q_{42}$ are cut off, and the transistors $Q_{36}$, $Q_{37}$ and $Q_{44}$ are turned on. The low-level of the inverted output $\overline{Q}$ of the F/F 36 turns OFF the transistor $Q_{59}$, so that the capacitor $C_3$ starts to be charged with the current $I_7$ from the constant-current source 33 through the resistor $R_{63}$. That is, the timer circuit starts its clocking.

The low-level of the inverted output $\overline{Q}$ of the F/F 36 is also fed to the first input of the NOR circuit 38. The second input of the NOR circuit 38 is supplied with the output of a comparator 35 which compares the charged level of the capacitor $C_3$ with a reference voltage $V_{REF1}$ from a voltage source 40. Since the capacitor $C_3$ has just started to be charged, the output of the comparator 35 is then at a low level. The third input of the NOR circuit 38 is supplied with the signal Va from the input circuit 7. The signal Va is at a low level just when the pulse signal $V_k$ is generated from the second circuit 5. Accordingly, the output of the NOR circuit 38 takes a high level, thereby turning the F/F 37 into the set state. The set state of the F/F 37 turns the transistor $Q_{58}$ off, since the transistor $Q_{56}$ receives the $\overline{Q}$ output of the F/F 37. Consequently, the transistors $Q_{57}$ and $Q_{56}$ are also cut off, and the transistors $Q_{55}$ and $Q_{49}$ are turned on the activate the differential amplifier composed of the transistors $Q_{50}$ to $Q_{54}$.

FIG. 6 also shows the schematic configuration of the integrator 8 in which a constant-current source 28 feeding the current $I_1$, a switch 29, a resistor $R_{58}$ and the capacitor $C_1$ are connected in series. A series circuit of a switch 30 and a constant-current source 32 feeding the current $I_2$ as well as a switch 31 are connected in parallel with a series circuit of the resistor $R_{58}$ and the capacitor $C_1$, respectively. The switches 29 and 30 are controlled in opening and closing thereof in response to the signal Va. The switch 29 is closed (the switch 30 being opened) with a low level of the signal Va, and the switch 30 is closed (the switch 29 being opened) with a high level of the signal Va. The switch 31 is controlled by the output Ve of the AND circuit 10 and closed with a high level of the signal Ve. The voltage across the capacitor $C_1$ serves a the signal Vb, as shown in FIG. 4.

As previously mentioned, when the F/F 37 comes into the set state, the differential amplifier comprising the transistors $Q_{50}$ to $Q_{54}$ is activated. The voltage level across the capacitor $C_1$ is supplied to the base of the transistor $Q_{50}$, and the voltage level across the capacitor $C_2$ is supplied to the base of the transistor $Q_{51}$ through a diode $D_6$. Therefore, the transistor $Q_{54}$ discharges the capacitor $C_2$ to make the base potentials of the transistors $Q_{50}$ and $Q_{51}$ equal to each other. At the time when the differential amplifier comprising the transistors $Q_{50}$ to $Q_{54}$ has started its operation, the capacitor $C_1$ is at the reference potential due to the on-state of the switch 31.

As a result, the capacitor $C_2$ is discharged by the transistor $Q_{54}$ to have a level higher than the reference potential by the forward voltage drop $V_F$ of the diode $D_6$. As seen from FIG. 4, therefore, as soon as the signal $V_k$ rises up to a high level, the level of the signal $V_c$ falls down. At the same time, the signals $V_a$ and $V_e$ are inverted to a low level, and therefore, the switch 29 is closed and the switches 31, 32 are opened. Consequently, the capacitor $C_1$ is charged with the current $I_1$.

The high-level Q output of the F/F 37 is supplied to the transistor $Q_{30}$ to turn it on. The collector of the transistor $Q_{30}$ is connected to the junction point between the base and the first collector of the transistor $Q_{41}$. Therefore, the current fed from the second collector of the transistor $Q_{41}$ is increased significantly. Since the signal $V_a$ is at a low level, the switch 27 is closed. Also, the transistors $Q_{36}$, $Q_{37}$ and $Q_{44}$ are under operation due to the output Q of the F/F 36. Therefore, the capacitor $C_2$ is charged with the increased current fed from the second collector of the transistor $Q_{41}$. Further, the increased current is larger than the current $I_1$ from the constant-current source 28. However, the charged levels of the capacitors $C_1$ and $C_2$ are compared with each other by the transistors $Q_{50}$ to $Q_{54}$, and therefore, a part of the current from the second collector of the transistor $Q_{41}$ flows through the transistor $Q_{54}$ to make the base potentials of the transistors $Q_{50}$ and $Q_{51}$ equal to each other. As a result, the capacitor $C_2$ is charged in such a way that its level becomes always higher than that of the capacitor $C_1$ by the forward voltage drop across the diode $D_6$. The switches 29 and 31 are, of course, composed of a semiconductor switch.

When the input signal $V_a$ is inverted from a low level to a high level, the switch 29 is opened and the switch 30 is closed. At this time point, the signal $V_e$ at a high level is derived from the AND circuit 10, so that the switch 31 is closed to discharge the capacitor $C_1$ immediately. When the signal $V_a$ is inverted from a low level to a high level, the third input of the NOR circuit 38 takes a high level. Accordingly, a low-level signal is supplied to the set terminal S of F/F 37, and further the reset terminal R thereof is supplied with the signal $V_a$ at a high level. As a result, the F/F 37 comes into the reset state. The high-level of the inverted output $\overline{Q}$ of the F/F 37 turns on the transistors $Q_{56}$ and $Q_{57}$ and cuts off the transistors $Q_{49}$ to $Q_{55}$. This stops the level comparison operation by the transistors $Q_{50}$ to $Q_{54}$. Further, the low-level of the output Q upon of the F/F 37 cuts off the transistor $Q_{30}$, thereby obtaining the current $I_3$ from the second collector of the transistor $Q_{41}$. At this time, since the current $I_{OUT}$ flowing through the ignition coil 4 is not under the current limiting state, the switch 27 remains closed. Therefore, the transistor $Q_{37}$ is in the off-state and $Q_{36}$ and $Q_{44}$ are in the on-state. Since the current $I_3$ flowing through the transistor $Q_{44}$ is supplied to the junction point between the first collector and the base of the transistor $Q_{41}$, the capacitor $C_2$ is further charged with the current $I_3$. When the output current $I_{OUT}$ reaches the current level $I_1$ to change the switch 27 to an open-state, the transistor $Q_{37}$ is turned on and $Q_{36}$ and $Q_{44}$ are cut off. The capacitor $C_2$ is then discharged with the current $I_4$ flowing through the transistor $Q_{37}$. As seen from the resistance values of the resistors $R_{42}$, $R_{44}$, $R_{51}$ and $R_{52}$ indicated in FIG. 6, the currents $I_1$ and $I_2$ are larger than the currents $I_3$ and $I_4$, respectively. That is, the charge/discharge time-constant of the capacitor $C_2$ is converted.

When the input signal $V_a$ is further inverted from a high level to a low level, the F/F 37 comes into the set state again. Therefore, the level of the capacitor $C_2$ is lowered by the transistor $Q_{54}$. After that, the foregoing operation will be repeated with the result that the feedback signal $V_c$ as shown in FIG. 4 is obtained through the emitter-follower transistor $Q_{47}$.

The charging to the capacitor $C_3$ with the current $I_7$ from the constant-current source 33 is proceeding. When the voltage across the capacitor $C_3$ becomes higher than the reference voltage $V_{REF1}$ from the voltage source 40, the comparator 35 produces the high-level signal $V_l$ (see FIG. 4). By the high-level signal $V_l$, the output of the NOR circuit 38 takes a low level and the F/F 37 comes into the reset state. Therefore, the transistor $Q_{30}$ is cut off and the transistors $Q_{49}$ to $Q_{55}$ are also cut off. This reset state remains unchanged regardless of changes in a level of the input signal $V_a$. As a result, the level control operation for the capacitor $C_2$ by the transistors $Q_{30}$, $Q_{49}$ to $Q_{55}$ is stopped.

Since the reference voltage $V_{REF2}$ from a voltage source 39 is set higher than $V_{REF1}$, a comparator 34 does not generate the signal $V_m$ of a high level simultaneously with the signal $V_l$. Accordingly, the F/F 36 remains in the set state and the transistors $Q_{36}$, $Q_{37}$ and $Q_{44}$ are still activated. In other words, the time-constant converting operation is still continued. Since the $C_2$ level control circuit 2, is under the stopped state in its operation, the voltage level of the feedback signal $V_c$ is gradually lowered due to the negative feedback operation of the first circuit 2, as shown in FIG. 4.

The charging to the capacitor $C_3$ proceeds further. When the charged level of the capacitor $C_3$ exceeds the reference voltage $V_{REF2}$ from the voltage source 39, the comparator 34 generates the high-level signal $V_m$ (see FIG. 4). In response to the high-level $V_m$ signal, the F/F 36 comes into the reset state. As a result, the transistors $Q_{36}$, $Q_{37}$ and $Q_{44}$ are cut off and $Q_{38}$, $Q_{39}$ and $Q_{42}$ are activated. The charge and discharge of the capacitor $C_2$ with the currents $I_1$ and $I_2$ are started to provide the normal charge/discharge time-constant.

Incidentailly, the F/Fs 36 and 37, NOR circuit 38 and the comparators 34 and 35 in FIG. 6 can be constituted by the circuits similar to those of the F/F, NOR circuit and comparator shown in FIG. 5.

With the operation as mentioned above, the feedback signal $V_c$ is controlled to has a level higher than that of the signal $V_b$ in response to the pulse signal $V_k$. As a result, the pulse width of the output signal $V_e'$ is coincident with that of the input signal $V_a$. The frequent generation of the undesired output signal $V_e'$ is prevented.

The time-constant converted circuit 22 in the third circuit 6 may be omitted.

Figure 7:
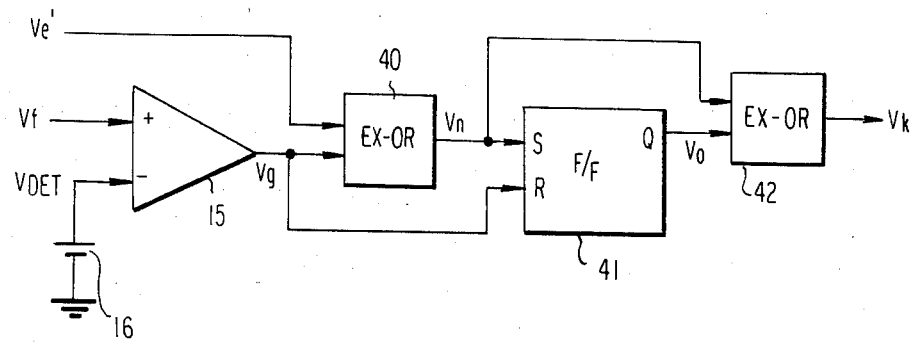
FIG. 7 is a circuit diagram showing another configuration of the second circuit.
Figure 8:
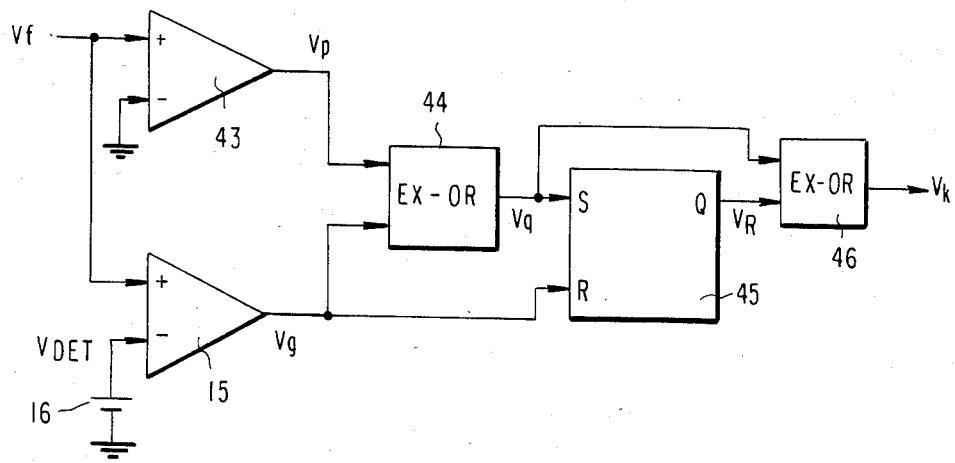
FIG. 8 is a circuit diagram showing still another configuration of the second circuit.

FIGS. 7 and 8 show other embodiments of the second circuit 5. The embodiment illustrated in FIG. 7 employs two exclusive logical sum (EX-OR) circuits 40 and 41 and an S-R flip-flop (F/F) 41 in addition to the comparator 15 and the voltage source 16 in order to utilize the signal $V_e'$ instead of the signal $V_a$. More specifically, the signal $V_e'$ is supplied to one input of the EX-OR circuit 40, and the other input thereof is supplied with the output $V_g$ of the comparator 15 obtained by comparing the signal $V_f$ with the comparison voltage $V_{DET}$. The output $V_g$ of the comparator 15 is also supplied to the reset terminal R of the F/F 41, and the set terminal S thereof is supplied with the output $V_n$ of the Ex-OR circuit 40. The Q output of the F/F 41 and the output Vn of the EX-OR circuit 40 are supplied to two inputs of the EX-OR circuit 42, the output of which is taken out as the signal Vk.

The embodiment illustrated in FIG. 8 is intended to generate the signal Vk by utilizing only the signal Vf from the current detector 12. It includes a comparator 43, two exclusive logical sum (EX-OR) circuits 44 and 46, and an S-R flip-flop (F/F) 45 in addition to the comparator 15 and the reference voltage source 16. The signal Vf is compared with the reference voltage $V_{DET}$ by the comparator 15 and further supplied to the non-inverting (+) input end of the comparator 43. The inverting (−) input terminal of the comparator 43 is grounded. The outputs Vg and Vp from the comparators 15 and 43 are supplied to the EX-OR circuit 44. The output Vg of the EX-OR circuit 44 is supplied to the set terminal S of the F/F 45 and further to one input of the EX-OR circuit 46. The output Vg of the comparator 15 is also supplied to the reset terminal R of the F/F 45, the Q output of which is supplied to the other input of the EX-OR circuit 46.

Figure 9:
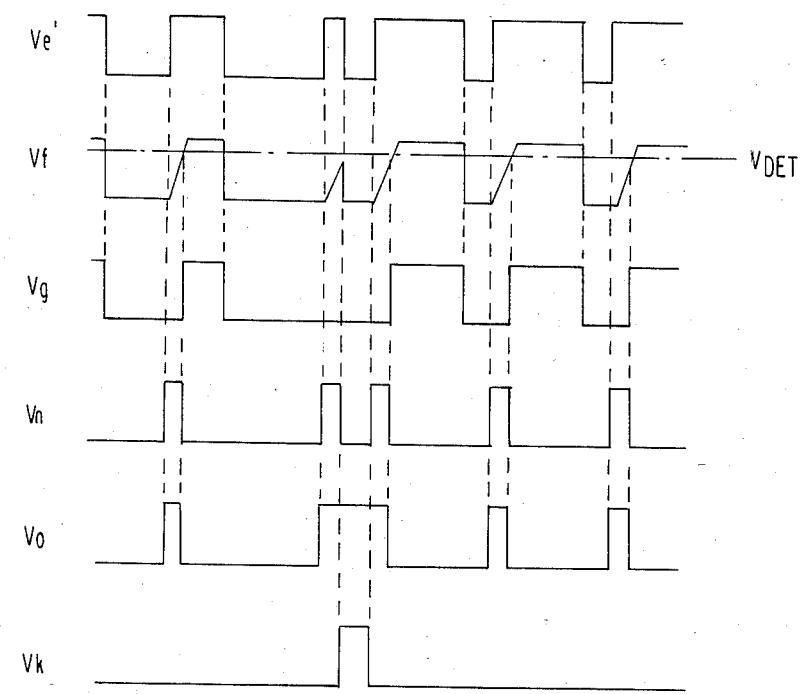
FIG. 9 is a view showing waveforms of voltage at respective points of the circuit as shown in FIG. 7.
Figure 10:
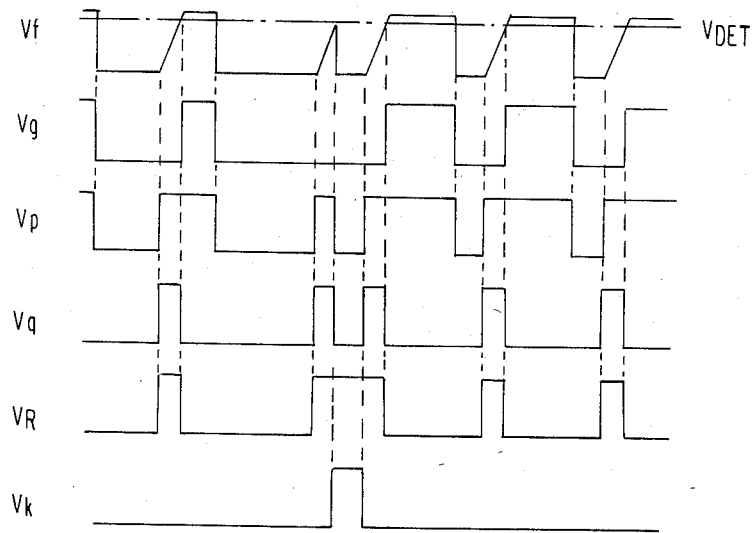
FIG. 10 is a view showing waveforms of voltage at respective points of the circuit as shown in FIG. 8.

Operations of the circuits shown in FIGS. 7 and 8 will be easily understood from the voltage waveforms shown in FIGS. 9 and 10, respectively, and therefore, the detailed explanation thereof will be omitted.

As described hereinbefore in detail, the present invention provides a circuit suitable for the ignition system for internal combustion engines.

It should be noted that the present invention is not limited to the embodiments as mentioned above, various modifications can be made without departing from the sprit and scope of the present invention. The present invention is applicable to other systems.

What is claimed is:

1. A circuit comprising a first circuit generating an output pulse signal in response to an input signal and having a feedback circuit producing a feedback signal in response to said output pulse signal, said output pulse signal having a pulse width controlled by said input and feedback signals, a second circuit detecting said pulse width of said output pulse signal and generating a detection signal when said pulse width is shorter than a predetermined width, and a third circuit invalidating said feedback signal in response to said detection signal from said second circuit to broaden the pulse width of said output pulse signal to be longer than said predetermined width.

2. The circuit as claimed in claim 1 further comprising an output circuit driven by said output pulse signal, said output circuit producing a current during a time corresponding to said pulse width of said output pulse signal, said second circuit detecting said pulse width in response to said current produced by said output circuit.

3. The circuit as claimed in claim 2 further comprising an inductive load, said current flowing through said inductive load.

4. The circuit as claimed in claim 1, wherein said thrid circuit changes the level of said feedback signal in response to said detection signal to broaden said pulse width of said output pulse signal.

5. An ignition system for an internal combustion engine comprising an input circuit producing a first signal of a pulse form in response to an input signal generated in synchronism with the revolution of said internal combustion engine, an ignition coil generating an ignition energy in response to a current flowing therethrough, a signal producing circuit producing a second signal in response to said current flowing through said ignition coil, a pulse generation circuit operating in a first state to generate a pulse signal having a pulse width that is controlled by said first and said second signals to be shorter than the pulse width of said first signal and in a second state to generate a pulse signal having a pulse width that is substantially equal to the pulse width of said first signal, the pulse width of said pulse signal corresponding to a time during which said current flows through said ignition coil, a detection circuit detecting said current flowing through said ignition coil and producing a first detection signal representing that said current reaches a predetermined value and a second detection signal representing that said current does not reach said predetermined value, and a control circuit controlling said pulse generation circuit in response to said first detection signal such that said pulse generation circuit operates in said first state and in response to said detection signal such that said pulse generation circuit operates in said second state.

6. The ignition system as claimed in claim 5, further comprising a timer circuit responding to said second detection signal and producing a timing signal after a passage of a predetermined time, said control circuit responding to said timing signal and switching over the operation of said pulse generation circuit from said second state to said first state.

7. An ignition system for an internal combustion engine comprising an integrator having a first capacitor and controlling a charging and a discharging of said first capacitor in response to an input pulse signal generated in synchronism with a revolution of said engine to produce a first signal, an ignition coil generating an ignition energy in response to a current flowing therethrough, a converter converting said current into a voltage signal, a detection circuit detecting a level of said voltage signal and producing a detection signal when said level of said voltage signal does not reach a predetermined value, a feedback circuit having a second capacitor and operating in a first state to control a charging and a discharging of said second capacitor in response to said voltage signal to produce a second signal and in a second state to control at least a charging of said second capacitor in response to said first signal to produce a third signal having a level larger in absolute value than said first signal, a control circuit controlling said feedback circuit such that said feedback circuit operates in said first state when said detection signal is not produced and in said second state when said detection signal is produced, a comparator comparing said first signal with said second or said third signal and outputting a comparison signal, a pulse generator responding to said input pulse signal and said comparison signal and generating an output pulse signal, and an output circuit responding to said output pulse signal and determining a time during which said current flows through said ignition coil, said time corresponding to the pulse width of said output pulse signal, the pulse width of said output pulse signal is controlled to take an approximately constant width shorter than the pulse width of said input pulse signal when said comparator compares said first signal with said second signal, and the pulse width of said output pulse signal is controlled to take the substantially same width as the pulse width of said input pulse signal when said comparator compares said first signal with said third signal.

8. The ignition system as claimed in claim 7, further comprising a timer circuit responding to said detection signal and producing a timing signal after a passage of a predetermined time, and means responsive to said timing signal for switching over the operation of said feedback circuit from said second state to said first state.

9. The ignition system as claimed in claim 7, wherein said detection circuit includes a level detector producing an output taking a high level when said level of said voltage signal is equal to or higher than said predetermined value and a low level when said level of said voltage signal is lower than said predetermined value, an inverter inverting said input pulse signal, a first logical circuit producing an output taking a high level when both of outputs of said level detector and said inverter have a low level and a low level when either one of outputs of said level detector and said inverter has a high level, a second logical circuit producing an output taking a high level in response to the high level output of said level detector and a low level in response to the high level output of said first logical circuit, and a third logical circuit producing said detection signal taking a high level when both of said input pulse signal and the output of said second logical circuit have a low level and a low level when either one of said input pulse signal and the output of said second logical circuit has a high level.

10. The ignition system as claimed in claim 9, wherein said level detector includes a second comparator having a first input end supplied with said voltage signal and a second input end supplied with a reference voltage, said reference voltage having a voltage value equal to said predetermined value, said first and third logical circuits comprising a NOR circuit, said second logical circuit comprising an S-R flip-flop circuit having a set input end supplied with the output of said second comparator and a reset input end supplied with the output of said first logical circuit.

11. The ignition system as claimed in claim 7, wherein said detection circuit includes a first circuit producing an output taking a high level when said level of said voltage signal is equal to or higher than said predetermined value and a low level when said level of said voltage signal is lower than said predetermined value, a second circuit producing an output taking a high level when said current flows through said ignition coil and a low level when no current flows through said ignition coil, a third circuit producing an output taking a high level when the outputs of said first and second circuits have a level different from each other and a low level when the outputs of said first and second circuits have the same level as each other, a fourth circuit producing an output taking a high level in response to the high level output of said third circuit and a low level in response to the high level output of said first circuit, and a fifth circuit producing said detection signal taking a high level when the outputs of said third and fourth circuits have a level different from each other and a low level when the outputs of said third and fourth circuits have the same level as each other.

12. The ignition system as claimed in claim 11, wherein said first circuit comprises a second comparator having a first input end supplied with said voltage signal and a second input end supplied with a reference voltage, said reference voltage having a voltage value equal to said predetermined value, said third and fifth circuits comprising an exclusive logical sum circuit, and said fourth circuit comprising an S-R flip-flop circuit having a set input end coupled to the output end of said third circuit and a reset input end coupled to the output end of said second comparator.

13. The ignition system as claimed in claim 12, wherein said second circuit comprises a third comparator having a first input and supplied with said voltage signal and a second input and supplied with a ground potential.

14. The ignition system as claimed in claim 7, wherein said detection circuit includes a second comparator having first and second input ends, a means for supplying said voltage signal to said first input end, a source of a reference voltage which is supplied to said second input end, said second comparator comparing said voltage signal supplied to said first input end with said reference voltage, a non-coincidence detector producing a pulse when the output of said second comparator is not coincident with said input pulse signal, and a flip-flop being set and reset in response to the outputs from said second comparator and said non-coincidence detector.

15. A circuit comprising a signal generator responding to a first pulse signal having a variable pulse width and generating a second pulse signal, first means responsive to said second pulse signal for producing a first control signal relative to a pulse width of said second pulse signal, second means responsive to said first control signal for controlling the pulse width of said second pulse signal so as to be stabilized against a variation in pulse width of said first pulse signal, the stabilized pulse width of said second pulse signal being shorter than the pulse width of said first pulse signal and longer than a predetermined pulse width, third means responsive to said second pulse signal for creating a detection signal representing that the pulse width of said second pulse signal is shorter than said predetermined pulse width, and fourth means responsive to said detection signal for producing a second control signal that inactivates said second means and causes said signal generator to generate the second pulse signal having the pulse width substantially equal to the pulse width of said first pulse signal.

16. The circuit as claimed in claim 15, further comprising fifth means responsive to said detection signal for outputting a third control signal after a passage of a predetermined time, and sixth means responsive to said third control means for inactivating said fourth means to inhibit the production of said second control signal from said fourth means, whereby said second means is activated to control the pulse width of said second pulse signal so as to be shorter than the pulse width of said first pulse signal.

17. A circuit comprising a pulse generator generating an output pulse signal in response to an input pulse signal having a variable pulse width, a switching circuit driven by said output pulse signal to form a conductive path through which a current flows, said switching circuit being conductive during a time corresponding to a pulse width of said output pulse signal, first means responsive to said current for producing a control signal relative to the pulse width of said output pulse signal, second means, when activated, responsive to said control signal for controllling the pulse width of said output pulse signal so as to be approximately constant irrespective of a variation in pulse width of said input pulse signal and to be shorter than the pulse width of said input signal, third means, when activated, for controlling the pulse width of said output signal so as to be coincident with the pulse width of said input pulse signal, fourth means for detecting a level of said current to produce a detection signal representing that said level of said current does not reach a predetermined level, and fifth means for activating said second means while inactivating said third means when said detection signal is not produced and for activating said third means while inactivating said second means when said detection signal is produced.

18. The circuit as claimed in claim 17, further comprising sixth means responsive to said detection signal for producing a timing signal after a passage of a predetermined time, said fifth means switching over said second means from the inactivated state to the activated state and said third means from the activated state to the inactivated state in response to said timing signal.

* * * * *

UNITED STATES PATENT AND TRADEMARK OFFICE
CERTIFICATE OF CORRECTION

PATENT NO. : 4,552,118
DATED : November 12, 1985
INVENTOR(S) : Hirokazu FUKAYA

It is certified that error appears in the above-identified patent and that said Letters Patent is hereby corrected as shown below:

Column 1, line 15, after "signal" delete "a" and substitute therefor --,--.

Column 9, line 39, change "ligntonconnected" to --lignton-connected--.

Column 14, line 42, change "Incidentailly" to --Incidentally--.

Column 15, line 32, change "sprit" to --spirit--.

Column 15, line 58, change "thrid" to --third--.

Column 18, line 61, change "controllling" to --controlling--.

Signed and Sealed this

Twentieth Day of May 1986

[SEAL]

*Attest:*

DONALD J. QUIGG

*Attesting Officer*     *Commissioner of Patents and Trademarks*